United States Patent
Li et al.

(10) Patent No.: US 12,060,294 B1
(45) Date of Patent: Aug. 13, 2024

(54) MANUFACTURING METHOD OF LARGE-OUTER-DIAMETER QUARTZ CRUCIBLE FOR CZOCHRALSKI (CZ) SINGLE CRYSTAL

(71) Applicant: JINZHOU YOUXIN QUARTZ TECHNOLOGY CO., LTD, Jinzhou (CN)

(72) Inventors: Zonghui Li, Jinzhou (CN); Man Chen, Jinzhou (CN); Ye Wang, Jinzhou (CN); Zhen Wang, Jinzhou (CN); ZhiQiang Zhang, Jinzhou (CN); XingWang Sun, Jinzhou (CN); Li Ma, Jinzhou (CN)

(73) Assignee: JINZHOU YOUXIN QUARTZ TECHNOLOGY CO., LTD, Jinzhou (CN)

(*) Notice: Subject to any disclaimer, the term of this patent is extended or adjusted under 35 U.S.C. 154(b) by 0 days.

(21) Appl. No.: 18/575,887

(22) PCT Filed: Mar. 31, 2022

(86) PCT No.: PCT/CN2022/084523
§ 371 (c)(1),
(2) Date: Jan. 2, 2024

(87) PCT Pub. No.: WO2023/184384
PCT Pub. Date: Oct. 5, 2023

(30) Foreign Application Priority Data

Mar. 29, 2022 (CN) .......................... 202210324084.9

(51) Int. Cl.
*C03B 35/00* (2006.01)
*C03B 20/00* (2006.01)
*C30B 35/00* (2006.01)

(52) U.S. Cl.
CPC ............ *C03B 20/00* (2013.01); *C30B 35/002* (2013.01); *C03B 2201/02* (2013.01)

(58) Field of Classification Search
None
See application file for complete search history.

(56) References Cited

U.S. PATENT DOCUMENTS

| 2,089,690 | A | * | 8/1937 | Cornelius | ............... F27D 11/04 373/32 |
| 2,993,079 | A | * | 7/1961 | Augsburger | ............ C03B 5/031 65/346 |

(Continued)

FOREIGN PATENT DOCUMENTS

| CN | 104926086 A | 9/2015 |
| CN | 108585450 A | 9/2018 |

(Continued)

*Primary Examiner* — Jodi C Franklin
(74) *Attorney, Agent, or Firm* — Bayramoglu Law Offices LLC (57) ABSTRACT

A manufacturing method of a large-outer-diameter quartz crucible for a Czochralski (CZ) single crystal is provided. The manufacturing method is a vacuum arc method, and specifically includes: releasing a high-temperature arc with an electrode bundle composed of 2N+1 electrodes to fuse a crucible blank, and performing rapid cooling to form an initial quartz crucible product, where N is an integer greater than or equal to 2; the 2N+1 electrodes include one central main electrode and 2N auxiliary electrodes; the 2N auxiliary electrodes are equidistantly distributed on a circumference with the central main electrode as a center; the central main electrode is aligned at an axis of the crucible mold; the 2N auxiliary electrodes are connected to two phases of an industrial three-phase power, and the two phases are alternately arranged on the auxiliary electrodes; the central main electrode is connected to a remaining phase of the industrial three-phase power.

12 Claims, 8 Drawing Sheets

(56) References Cited

U.S. PATENT DOCUMENTS

| | | | | |
|---|---|---|---|---|
| 3,264,095 | A * | 8/1966 | Ackermann | F27B 5/04 373/65 |
| 3,739,066 | A * | 6/1973 | Ermold | B22D 23/10 373/67 |
| 4,581,745 | A * | 4/1986 | Mathews | H05B 7/20 164/514 |
| 6,553,787 | B1 * | 4/2003 | Akiho | C03B 19/095 65/144 |
| 6,853,673 | B2 * | 2/2005 | Fukui | C30B 15/10 373/62 |
| 7,905,112 | B2 | 3/2011 | Fukui et al. | |
| 8,268,077 | B2 * | 9/2012 | Takano | C30B 15/14 117/34 |
| 8,657,957 | B2 * | 2/2014 | Kishi | C30B 35/002 117/200 |
| 8,806,892 | B2 * | 8/2014 | Sudo | C03B 19/095 65/17.3 |
| 9,221,709 | B2 * | 12/2015 | Kelly | C03B 29/02 |
| 2003/0113449 | A1 * | 6/2003 | Tsuji | C03B 29/02 427/376.1 |
| 2003/0210731 | A1 * | 11/2003 | Fukui | C30B 35/002 373/88 |
| 2010/0071613 | A1 * | 3/2010 | Kishi | C30B 35/002 65/144 |
| 2010/0162767 | A1 * | 7/2010 | Shimazu | C03B 19/095 65/348 |
| 2010/0170298 | A1 * | 7/2010 | Fukui | C03B 19/095 65/144 |
| 2010/0229599 | A1 * | 9/2010 | Fujita | C30B 15/10 65/33.9 |
| 2012/0141622 | A1 * | 6/2012 | Sudo | C03B 19/095 425/174.6 |
| 2012/0141704 | A1 * | 6/2012 | Sudo | C03B 19/066 428/34.4 |
| 2012/0161631 | A1 * | 6/2012 | Kuwabara | H05G 2/003 315/108 |
| 2013/0128912 | A1 * | 5/2013 | Molins | C03B 19/095 373/27 |
| 2019/0078231 | A1 * | 3/2019 | Mehdizadeh Dehkordi | C03B 19/066 |
| 2020/0392032 | A1 * | 12/2020 | Kitahara | C30B 29/06 |

FOREIGN PATENT DOCUMENTS

| | | |
|---|---|---|
| CN | 111620553 A | 9/2020 |
| JP | 2015147688 A | 8/2015 |

* cited by examiner

MANUFACTURING METHOD OF LARGE-OUTER-DIAMETER QUARTZ CRUCIBLE FOR CZOCHRALSKI (CZ) SINGLE CRYSTAL

CROSS REFERENCE TO THE RELATED APPLICATIONS

This application is the national phase entry of International Application No. PCT/CN2022/084523, filed on Mar. 31, 2022, which is based upon and claims priority to Chinese Patent Application No. 202210324084.9, filed on Mar. 29, 2022, the entire contents of which are incorporated herein by reference.

TECHNICAL FIELD

The present disclosure relates to the technical field of manufacture of quartz crucibles for Czochralski (CZ) single crystals, and in particular to a manufacturing method of a large-outer-diameter quartz crucible for a CZ single crystal.

BACKGROUND

Monocrystalline silicon is one of the main materials for manufacturing silicon-based semiconductors and solar cells. It is mainly prepared by a CZ method. In the CZ method, a polysilicon material is placed into a quartz crucible, and heated to form a silicon melt. Under the driving of a pull rod, seed crystals are pulled down to contact the silicon melt, and then pulled up slowly to form a monocrystalline silicon rod. Usually, the quartz crucible is a double-layer structure. An inner wall of the quartz crucible is a transparent layer without bubbles, while an outer wall of the quartz crucible is a non-transparent layer with many bubbles. The inner wall comes in contact with the silicon melt. In case of bubbles in the inner wall, the bubbles are broken at a high temperature for erosion of the silicon melt. If broken fragments are dissolved in the silicon melt, both a yield and a quality of the monocrystalline silicon are affected. The outer wall requires a specific number of sized bubbles, because it needs to uniformly diffuse heat from a heater, thereby uniformly heating the silicon melt. The quartz crucible serves as a unique material contacting the silicon melt, and its quality is highly associated with a quality of the monocrystalline silicon. For example, the quality of the monocrystalline silicon depends on a content of bubbles in the inner wall of the quartz crucible, a purity of the quartz crucible, a high-temperature deformation resistance of the quartz crucible, etc.

The quartz crucible is generally manufactured by a vacuum arc method. Specifically, a high-purity quartz sand material is poured into a graphite mold or a metal mold, uniformly formed on an inner surface of the mold through a forming device, and molten at 3,000° C. or above through a high-temperature arc (which is generated by three graphite electrodes or copper electrodes of a three-phase arc furnace). Rapid cooling is performed to form the quartz (glass) crucible. In this process, the temperature of the arc dominates the quality of the quartz crucible, mainly including a content of bubbles in the inner wall of the crucible and a purity (impurity content), a high-temperature deformation resistance and a glass transition degree of the crucible. Therefore, it is very important to optimize arc control.

With development of the semiconductor industry and the solar energy industry, the size of the monocrystalline silicon has become 8 inches and 12 inches from 4 inches, 6 inches and 8 inches, while the size of the quartz crucible has become 24 inches, 28 inches, 32 inches and 36 inches from 16 inches, 18 inches and 24 inches (the size refers to an outer diameter of the crucible). In the industry, the crucible with the size of 28 inches or more is called a large-size crucible. The large-size crucible often has a depth of 500-750 mm. Compared with a small-size quartz crucible, the large-size quartz crucible obviously has a larger outer diameter and a larger wall thickness. In a normal fusion process, by powering on three electrodes to discharge an arc, a temperature for producing the crucible with the size of 22-24 inches can be met. However, in production of the large-size quartz crucible, the temperature from the three electrodes cannot fully melt the material on the inner surface of the large-size mold, and the temperature loss is serious. If fusion time is prolonged, the energy consumption is large and the effect is not obvious. Consequently, the outline dimensions of the quartz crucible are hardly formed, the glass transition degree on an inner surface of the quartz crucible is reduced, and the quality of the quartz crucible is affected. In a process of pulling up the single crystals, the quartz crucible is prone to collapse, crystallization, etc.

In order to meet the manufacturing requirements of the large-size crucible, it is proposed to increase a number of the electrodes. For example, in a patent CN 104926086 A, six graphite electrodes are equidistantly provided on a circumference with an axis of a crucible mold as a center. The six electrodes are connected to form a regular hexagon fittingly. In U.S. Pat. No. 6,853,673 B2 and U.S. Pat. No. 7,905,112 B2, four two-phase electrodes, or six or nine three-phase graphite electrodes are also equidistantly distributed on a circumference with an axis of a crucible mold as a center to form a regular hexagon or a regular nonagon. The production temperature can be higher by increasing the number of the electrodes indeed. However, with the above electrodes, in spite of a wider range of arc light, a central temperature of the arc light is reduced due to discharge between adjacent electrodes. Thus, a middle bottom of the quartz crucible has an undesirable quality (for example, there are an air vent and a high impurity content). This is mainly ascribed to a large depth of the large-size crucible. With six or nine electrodes, consideration is given to a peripheral wall of the crucible, but not a bottom of the crucible. The bottom of the crucible has an inadequate temperature and an insufficient polishing degree. A part of gasified impurities and dust cannot be removed when falling onto the bottom at the low temperature. In view of this, in the Japanese patent JP 2015147688 A, six graphite electrodes are distributed on concentric circumferences with an axis of a crucible mold as a center, thereby forming internal and external regular triangles. There are two three-phase powers inside and outside to heat the bottom of the crucible blank. However, the following problems are still presented: (1) The center among the graphite electrodes is hollow, and the central temperature is still not enough. (2) The device is designed complexly and troublesomely, and difficultly controlled in a high-temperature arc environment. (3) Many problems occur in use and thus the system is not put into practice. (4) Discharge may also occur between an internal circle and an external circle. The two three-phase powers have a great impact on a production system and a power grid.

SUMMARY

(I) Technical Problem to be Solved

In view of the above defects and shortages in the prior art, the present disclosure provides a manufacturing method of a large-outer-diameter quartz crucible for a CZ single crystal. By providing a more reasonable number of electrodes and more reasonable distribution positions of the electrodes, the present disclosure has a higher central temperature when the electrodes release an arc and a higher fusion temperature for a bottom of a quartz crucible blank, and achieves a better polishing degree for the bottom of the crucible and a better quality for the bottom of the crucible, thereby meeting manufacturing requirements of the large-size quartz crucible.

(II) Technical Solutions

To achieve the above objective, the present disclosure adopts the following technical solutions:

The present disclosure provides a manufacturing method of a large-outer-diameter quartz crucible for a CZ single crystal. The manufacturing method is a vacuum arc method, and includes: pouring a high-purity quartz sand material into a crucible mold, uniformly forming the quartz sand material on an inner surface of the mold through a forming device to form a crucible blank, releasing a high-temperature arc with an electrode bundle composed of 2N+1 electrodes to fuse the crucible blank, and performing rapid cooling to form an initial quartz crucible product, where N is an integer greater than or equal to 2; the 2N+1 electrodes include one central main electrode and 2N auxiliary electrodes; the 2N auxiliary electrodes are equidistantly distributed on a circumference with the central main electrode as a center; and the central main electrode is aligned at an axis of the crucible mold; and the 2N auxiliary electrodes are connected to two phases of an industrial three-phase power, and the two phases are alternately arranged on the auxiliary electrodes; the central main electrode is connected to a remaining phase of the industrial three-phase power; and in a fusion process of the crucible blank, discharge between two adjacent ones of the 2N auxiliary electrodes generates a high-temperature arc, and discharge between the 2N auxiliary electrodes and the central main electrode also generates a high-temperature arc.

According to a preferred embodiment of the present disclosure, N=2-4, specifically, there are five, seven or nine electrodes in the electrode bundle.

According to a preferred embodiment of the present disclosure, a cross-sectional area of the central main electrode is greater than a cross-sectional area of each single one of the auxiliary electrodes.

According to a preferred embodiment of the present disclosure, the central main electrode has the cross-sectional area of S1, and the single auxiliary electrode has the cross-sectional area of S2, S1 and S2 satisfying: $1.5S2 \leq S1 \leq 3.8S2$. The central main electrode is coarser than the surrounding single auxiliary electrode. It is better to satisfy the above requirement. Otherwise, an imbalance may exist in the three-phase power to impact a power supply system. Preferably, $S1=2S2$.

According to a preferred embodiment of the present disclosure, the auxiliary electrode has a diameter of 55-65 mm, and the central main electrode has a diameter of 68-125 mm.

According to a preferred embodiment of the present disclosure, with calculation based on central points of lower end surfaces of the 2N auxiliary electrodes, a radius of the circumference for the 2N auxiliary electrodes is ¼-¾ of an outer radius of a fused crucible.

According to a preferred embodiment of the present disclosure, a lower end surface of the central main electrode and lower end surfaces of the 2N auxiliary electrodes are located on a same plane, and the central main electrode and the 2N auxiliary electrodes each can move down with a loss of the electrode.

According to a preferred embodiment of the present disclosure, the central main electrode is radially fixed; and the 2N auxiliary electrodes are adjustable to expand and collapse relative to the central main electrode.

According to a preferred embodiment of the present disclosure, with calculation based on central points of lower end surfaces of the 2N auxiliary electrodes, an expanding and collapsing amplitude of the 2N auxiliary electrodes is as follows: a radius of the circumference for the 2N auxiliary electrodes is ¼-⅔ of an outer radius of a fused crucible.

According to a preferred embodiment of the present disclosure, the central main electrode and the 2N auxiliary electrodes are respectively connected to a copper rod; the copper rod connected to the central main electrode is fixed at a middle of a fixed frame; a top end of the copper rod connected to each of the 2N auxiliary electrodes is fixed by a clamping mechanism; corresponding to a number of the auxiliary electrodes, there are 2N clamping mechanisms; a pivotal point at a middle of each of the clamping mechanisms is rotatably connected to the fixed frame; one end of the clamping mechanism is connected to a nut through a connecting rod; the nut is sleeved on a threaded rod; a bottom end of the threaded rod is integrated with the fixed frame, and the threaded rod is a rotating member; and by rotating the threaded rod, the nut moves up and down on the threaded rod, and drives the 2N clamping mechanisms to expand and collapse, thereby driving the 2N auxiliary electrodes to expand and collapse relative to the central main electrode.

According to a preferred embodiment of the present disclosure, in the whole fusion process, a vacuum degree is controlled at −0.093 Mpa to −0.1 Mpa; a vacuum system is connected to timely pump out impurities such as a gas in the fusion, thereby ensuring a purity of the crucible product; and each of the electrodes has a power of 1,000-2,000 KW.

According to a preferred embodiment of the present disclosure, when a quartz crucible with an outer diameter of 28 inches is fused, the electrode has a power of 1,000-1,100 KW; when a quartz crucible with an outer diameter of 32 inches is fused, the electrode has a power of 1,300-1,400 KW; and when a quartz crucible with an outer diameter of 36 inches is fused, the electrode has a power of 1,500-1,600 KW.

According to a preferred embodiment of the present disclosure, the manufactured initial quartz crucible product is sequentially subjected to cutting, inspection, cleaning, drying, packing and storage.

(III) Beneficial Effects

According to the prior art, because of the industrial three-phase power used for manufacturing the quartz crucible, a number of the electrodes is a multiple of 3. In the present disclosure, 2N+1 electrodes are used. The central main electrode is provided at the center, and connected to one phase of the power. The remaining 2N auxiliary electrodes are equidistantly provided on a circumference, and alternately connected to two phases of the power. The technical solutions are unconceivable for manufacturers and designers in the art. A high-temperature arc is generated between two adjacent ones of the 2N auxiliary electrodes on the circumference, and a high-temperature arc is also generated between the 2N auxiliary electrodes on the circumference and the main electrode at the center. Thus, the arc center has a very high temperature. The auxiliary electrodes on the circumference are mainly used to fuse a peripheral wall of the crucible blank and perform high-temperature polishing (this improves the glass transition degree, and makes impurities gasified and volatilized, thereby achieving a higher purity). The arc center is mainly used to perform high-temperature polishing on the bottom of the large-size crucible, thereby manufacturing the quartz crucible product with less air vents, a higher glass transition degree and a lower impurity content, and improving a production yield of the crucible. Further, the central main electrode is coarser than the surrounding auxiliary electrodes, and the central main electrode has a basically same oxidation rate as the auxiliary electrodes. This further improves a heating effect of the arc.

In conclusion, according to the manufacturing method of the present disclosure, since one central main electrode is provided and connected to one phase of the power, the surrounding 2N auxiliary electrodes can have a relatively large expansion degree. This increases a distance between adjacent auxiliary electrodes on the circumference, and widens a heating range. The present disclosure not only considers the problem that the peripheral wall of the large-size crucible is heated hardly for a large inner diameter, but also solves the problems of an inadequate bottom temperature and an insufficient polishing degree of the crucible. The manufacturing method of the present disclosure is particularly applied to production of the large-size crucible, and improves the bottom quality of the crucible.

DETAILED DESCRIPTION OF THE EMBODIMENTS

To facilitate a better understanding of the present disclosure, the present disclosure is described in detail below with reference to the accompanying drawings and specific implementations.

Figure 1:
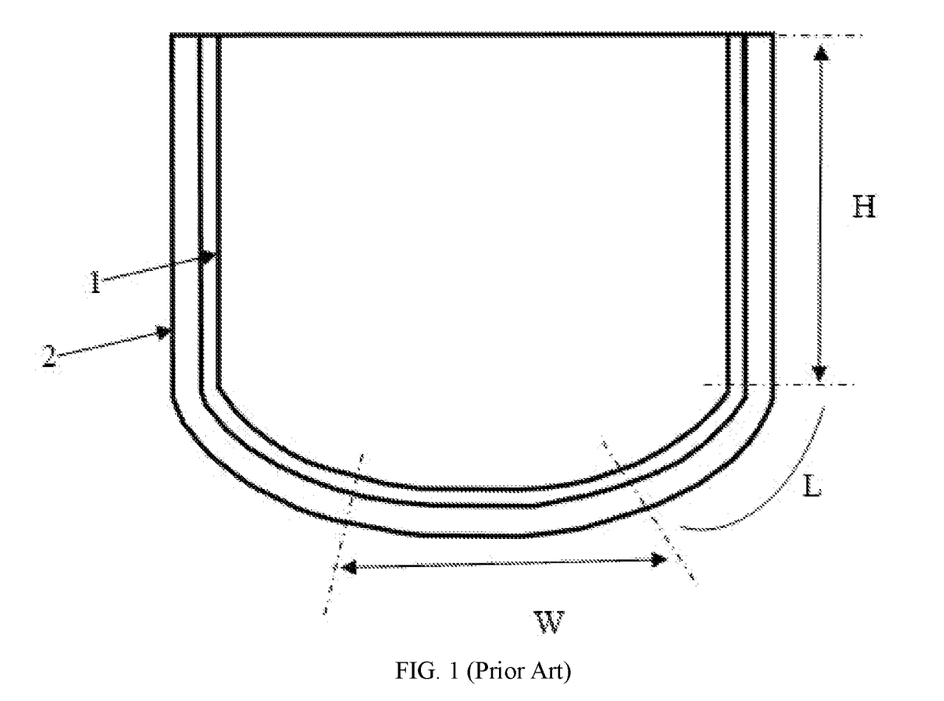
FIG. 1 is a schematic structural view of a quartz crucible.

As shown in FIG. 1, a quartz crucible includes inner transparent layer 1 and an outer non-transparent layer 2. The transparent layer 1 comes in direct contact with a silicon melt. The transparent layer 1 includes straight wall surface H, arc transitional surface L, and bottom W.

Figure 2:
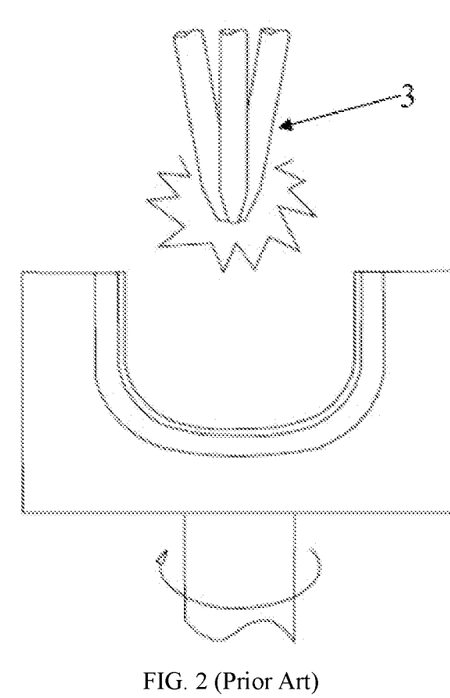
FIG. 2 is a schematic view for manufacturing a quartz crucible with electrodes by fusion.
Figure 3:
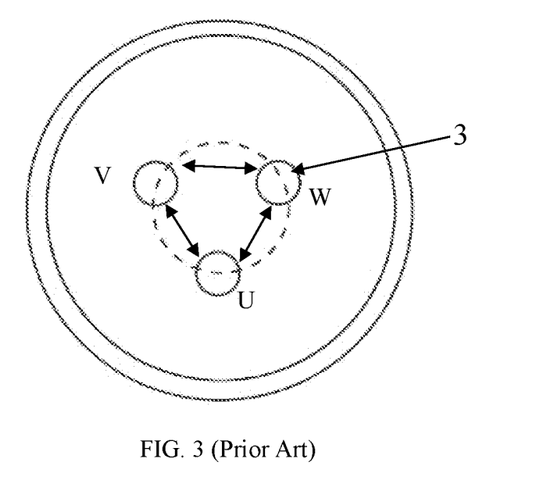
FIG. 3 is a schematic view for manufacturing a quartz crucible with three three-phase graphite electrodes by fusion in a prior art.

FIGS. 2-3 are a schematic view for manufacturing a quartz crucible with a high-temperature arc from three three-phase graphite electrodes by fusion in a conventional art. The three three-phase graphite electrodes 3 are equidistantly distributed on a circumference with an axis of a crucible mold as a center to form an equilateral triangle. The three three-phase graphite electrodes 3 are respectively connected to a phase U, a phase W and a phase V. An arc is generated by discharge between the phase U and the phase W, discharge between the phase W and the phase V, and discharge between the phase V and the phase U. A resulting heat source has a small area and is unsuitable for production of a large-size quartz crucible.

Figure 4:
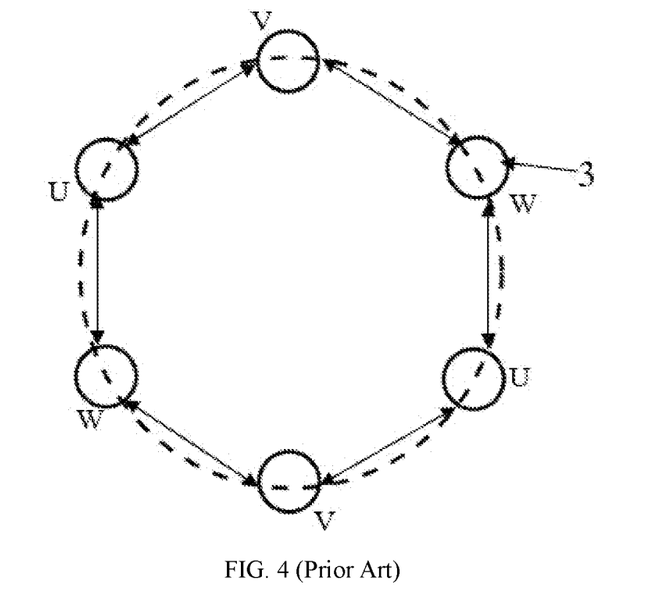
FIG. 4 is a schematic view for manufacturing a quartz crucible with six three-phase graphite electrodes by fusion in a prior art.

FIG. 4 is a schematic view for manufacturing a quartz crucible with a high-temperature arc from six three-phase graphite electrodes by fusion in a prior art. The six three-phase graphite electrodes 3 are equidistantly distributed on a circumference with an axis of a crucible mold as a center to form a regular hexagon. The six graphite electrodes 3 are respectively connected to a phase U, a phase W, a phase V, the phase U, the phase W and the phase V. An arc is generated by discharge between the phase U and the phase W, discharge between the phase W and the phase V, discharge between the phase V and the phase U, discharge between the phase U and the phase W, discharge between the phase W and the phase V, discharge between the phase V and the phase U. A resulting heat source has an area greater than the heat source formed by the three three-phase electrodes in FIG. 3. However, a center of the arc still has a low temperature. This cannot fuse the bottom of the crucible adequately, and is particularly unsuitable for production of a large-size quartz crucible.

Figure 5:
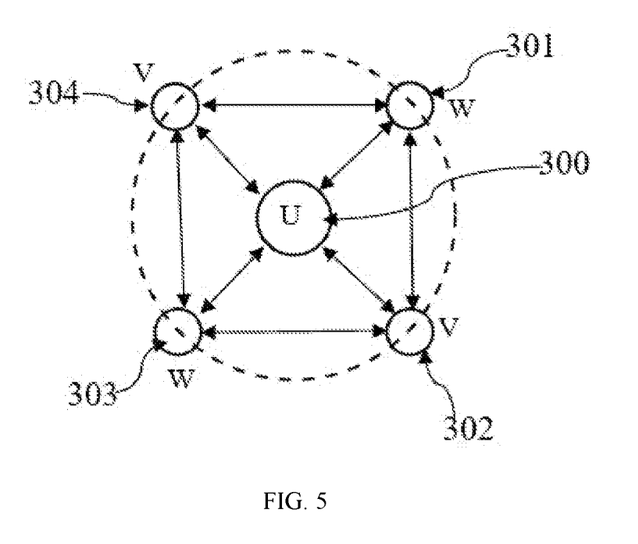
FIG. 5 is a schematic view of five three-phase electrodes according to Embodiment 1 of the present disclosure.
Figure 6:
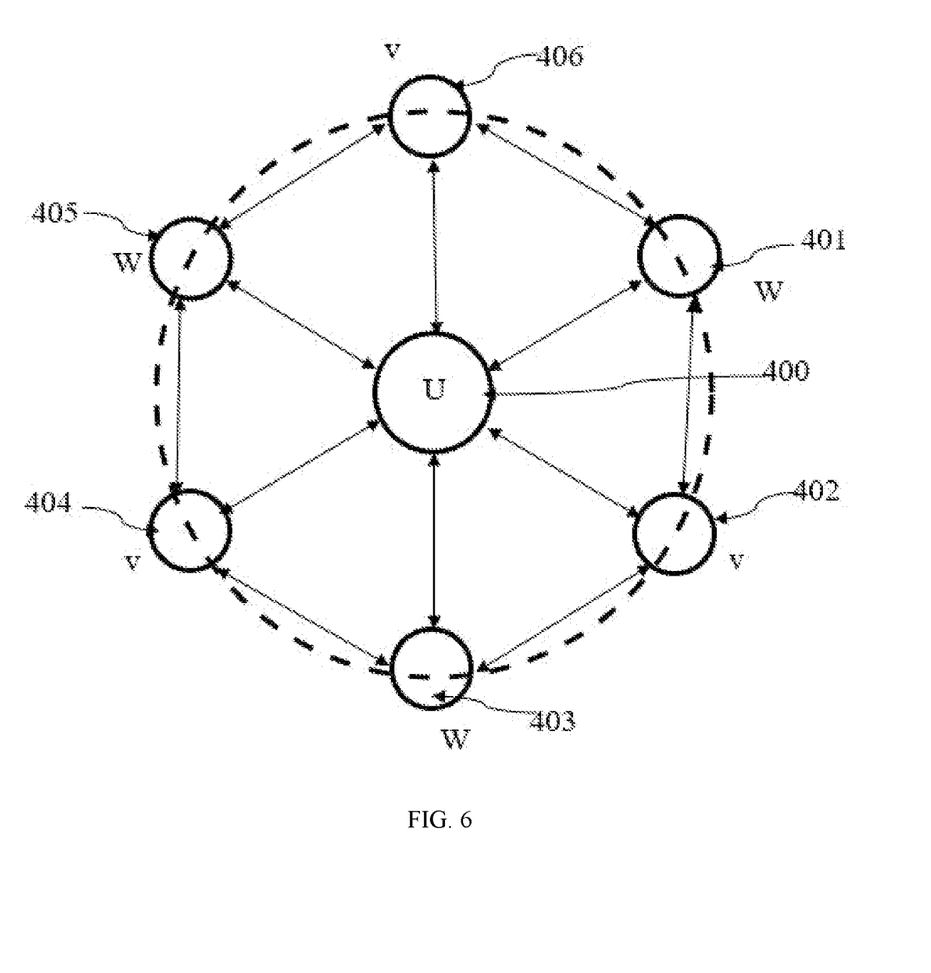
FIG. 6 is a schematic view of seven three-phase electrodes according to Embodiment 2 of the present disclosure.
Figure 7:
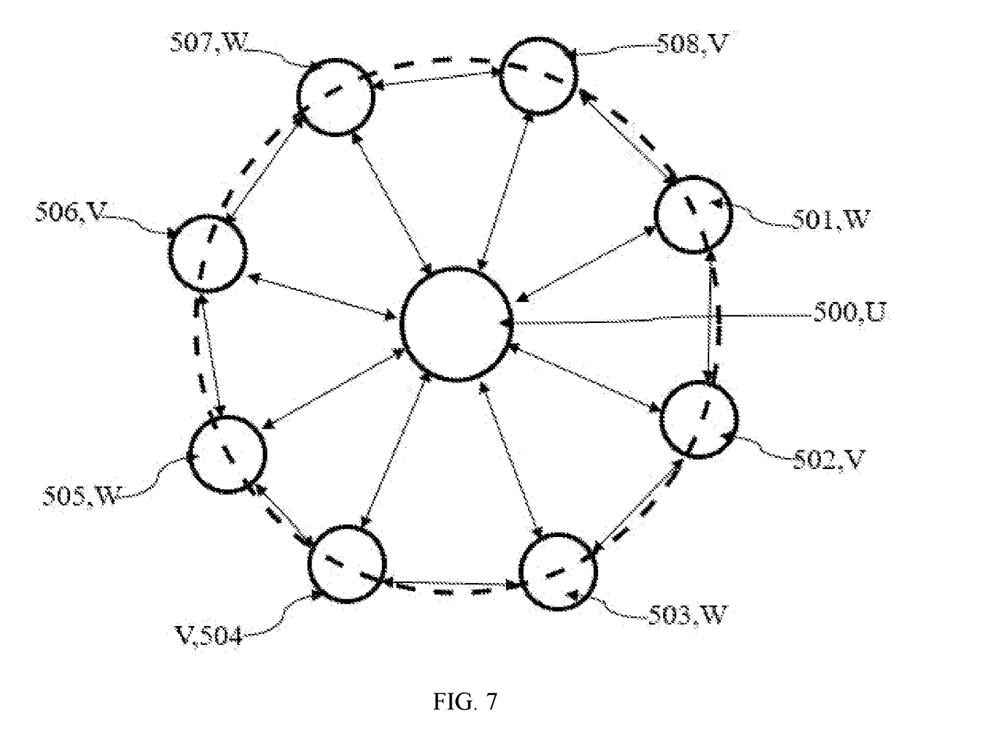
FIG. 7 is a schematic view of nine three-phase electrodes according to Embodiment 3 of the present disclosure.

The following specific Embodiments 1-3 of the present disclosure correspond to FIGS. 5-7.

Embodiment 1

FIG. 5 is a preferred Embodiment 1 of the present disclosure. In the embodiment, a quartz crucible with an outer diameter of 28 inches is manufactured. A manufacturing method includes: A high-purity quartz sand material is poured into crucible mold 10, and uniformly formed on an inner surface of the crucible mold 10 through a forming device to form crucible blank 20. Electrode bundle 30 composed of five graphite electrodes is used to release a high-temperature arc to fuse the crucible blank. Rapid cooling is performed to form an initial quartz crucible product. In a whole fusion process, a vacuum degree is controlled at −0.093 Mpa to −0.1 Mpa (a vacuum system is connected to pump out impurities such as a gas in fusion). The electrodes each have a power of 1,000 KW. The manufactured initial quartz crucible product is sequentially subjected to cutting, inspection, cleaning, drying, packing and storage.

The electrode bundle 30 includes one coarse central main electrode 300 and four fine auxiliary electrodes 301, 302, 303 and 304. The central main electrode 300 has a diameter of 100 mm, and the auxiliary electrodes 301, 302, 303 and 304 have a diameter of about 60±0.5 mm. The central main electrode 300 is aligned at an axis of the crucible mold. The four auxiliary electrodes 301, 302, 303 and 304 are equidistantly distributed on a circumference with the central electrode as a center, and can be connected to form a square. Based on central points of the auxiliary electrodes, a radius of the circumference for the four auxiliary electrodes 301, 302, 303 and 304 is ¼ of an outer radius of a fused crucible. The central main electrode 300 is connected to a phase U of an industrial three-phase AC power, while the four auxiliary electrodes 301, 302, 303 and 304 are respectively connected to a phase W, a phase V, the phase W and the phase V of the industrial three-phase AC power. A lower end surface of the central main electrode 300 and lower end surfaces of the four auxiliary electrodes 301, 302, 303 and 304 are located on a same plane. The central main electrode 300 and the four auxiliary electrodes 301, 302, 303 and 304 each can move down with a loss of the electrode. In the process of fusing the crucible blank, discharge between two adjacent ones of the four auxiliary electrodes 301, 302, 303 and 304 generates a high-temperature arc. Meanwhile, discharge between the auxiliary electrodes 301, 302, 303 and 304 and the central main electrode 300 also generates a high-temperature arc.

Embodiment 2

FIG. 6 is a preferred Embodiment 2 of the present disclosure. In the embodiment, a quartz crucible with an outer diameter of 32 inches is manufactured. A manufacturing method includes: A high-purity quartz sand material (the high-purity quartz sand has a purity of greater than or equal to 99.99%) is poured into crucible mold 10, and uniformly formed on an inner surface of the crucible mold 10 through a forming device to form crucible blank 20. Electrode bundle 40 composed of seven graphite electrodes is used to release a high-temperature arc to fuse the crucible blank. A lower end of the electrode bundle is 550 mm away from a bottom of the crucible. Rapid cooling is performed to form an initial quartz crucible product. In a whole fusion process, a vacuum degree is controlled at –0.093 Mpa to –0.1 Mpa. The electrodes each have a power of 1,400 KW. The manufactured initial quartz crucible product is sequentially subjected to cutting, inspection, cleaning, drying, packing and storage.

The electrode bundle 40 includes one coarse central main electrode 400 and six fine auxiliary electrodes 401, 402, 403, 404, 405 and 406. The central main electrode 400 has a diameter of 110 mm, and the six auxiliary electrodes 401, 402, 403, 404, 405 and 406 have a diameter of about 60±0.5 mm. The central main electrode 400 is aligned at an axis of the crucible mold. The six auxiliary electrodes 401, 402, 403, 404, 405 and 406 are equidistantly distributed on a circumference with the central electrode as a center, and can be connected to form a regular hexagon. Based on central points of the auxiliary electrodes, a radius of the circumference for the six auxiliary electrodes 401, 402, 403, 404, 405 and 406 is ¾ of an outer radius of a fused crucible. The central main electrode 400 is connected to a phase U of an industrial three-phase AC power, while the six auxiliary electrodes 401, 402, 403, 404, 405 and 406 are respectively connected to a phase W, a phase V, the phase W, the phase V, the phase W and the phase V of the industrial three-phase AC power. A lower end surface of the central main electrode 400 and lower end surfaces of the six auxiliary electrodes 401, 402, 403, 404, 405 and 406 are located on a same plane. The central main electrode 400 and the six auxiliary electrodes 401, 402, 403, 404, 405 and 406 each can move down with a loss of the electrode. In the process of fusing the crucible blank, discharge between two adjacent ones of the six auxiliary electrodes 401, 402, 403, 404, 405 and 406 generates a high-temperature arc. Meanwhile, discharge between the auxiliary electrodes 401, 402, 403, 404, 405 and 406 and the central main electrode 400 also generates a high-temperature arc.

Embodiment 3

FIG. 7 is a preferred Embodiment 3 of the present disclosure. In the embodiment, a quartz crucible with an outer diameter of 36 inches is manufactured. A manufacturing method includes: A high-purity quartz sand material (the high-purity quartz sand has a purity of greater than or equal to 99.99%) is poured into crucible mold 10, and uniformly formed on an inner surface of the crucible mold 10 through a forming device to form crucible blank 20. Electrode bundle 50 composed of nine graphite electrodes is used to release a high-temperature arc to fuse the crucible blank. A lower end of the electrode bundle is 550 mm away from a bottom of the crucible. Rapid cooling is performed to form an initial quartz crucible product. In a whole fusion process, a vacuum degree is controlled at –0.093 Mpa to –0.1 Mpa. The electrodes each have a power of 1,600 KW. The manufactured initial quartz crucible product is sequentially subjected to cutting, inspection, cleaning, drying, packing and storage.

The electrode bundle 50 includes one coarse central main electrode 500 and eight fine auxiliary electrodes 501, 502, 503, 504, 505, 506, 507 and 508. The central main electrode 500 has a diameter of 110 mm, and the eight auxiliary electrodes 501, 502, 503, 504, 505, 506, 507 and 508 have a diameter of about 58 mm. The central main electrode 500 is aligned at an axis of the crucible mold. The eight auxiliary electrodes 501, 502, 503, 504, 505, 506, 507 and 508 are equidistantly distributed on a circumference with the central electrode as a center, and can be connected to form a regular octagon. Based on central points of the auxiliary electrodes, a radius of the circumference for the eight auxiliary electrodes 501, 502, 503, 504, 505, 506, 507 and 508 is ⅔ of an outer radius of a manufactured crucible. The central main electrode 500 is connected to a phase U of an industrial three-phase AC power, while the eight auxiliary electrodes 501, 502, 503, 504, 505, 506, 507 and 508 are respectively connected to a phase W, a phase V, the phase W, the phase V, the phase W, the phase V, the phase W and the phase V of the industrial three-phase AC power. A lower end surface of the central main electrode 500 and lower end surfaces of the eight auxiliary electrodes 501, 502, 503, 504, 505, 506, 507 and 508 are located on a same plane. The central main electrode 500 and the eight auxiliary electrodes 501, 502, 503, 504, 505, 506, 507 and 508 each can move down with a loss of the electrode. In the process of fusing the crucible blank, discharge between two adjacent ones of the eight auxiliary electrodes 501, 502, 503, 504, 505, 506, 507 and 508 generates a high-temperature arc. Meanwhile, discharge between the auxiliary electrodes 501, 502, 503, 504, 505, 506, 507 and 508 and the central main electrode 500 also generates a high-temperature arc.

In the above Embodiments 1-3, the central main electrode 300, 400 or 500 is radially fixed, and the remaining auxiliary electrodes are also radially fixed. Preferably, with calculation based on central points of the auxiliary electrodes, a radius of the circumference for all of the auxiliary electrodes is ¼-¾ of an outer radius of a fused crucible.

In addition, in other embodiments, an electrode bundle with an adjustable radius of a circumference for the auxiliary electrodes can be provided. For example, the central main electrode 300, 400 or 500 is radially fixed, and the remaining auxiliary electrodes can be adjusted to expand and collapse relative to the central main electrode 300, 400 or 500. That is, a radius of the circumference for the remaining auxiliary electrodes (with calculation based on central points of lower end surfaces of the auxiliary electrodes) is variable. A variable amplitude is preferably ¼-⅔ of the outer radius of the fused crucible (with a large adjusted amplitude, there is an obvious height difference between the lower end surfaces of the electrodes. This is not favorable for generation of the arc). In this case, a lower end surface of the central main electrode and lower end surfaces of the remaining auxiliary electrodes are kept on a same plane as much as possible, and the central main electrode and the auxiliary electrodes each can move down with a loss of the electrode.

Figure 8:
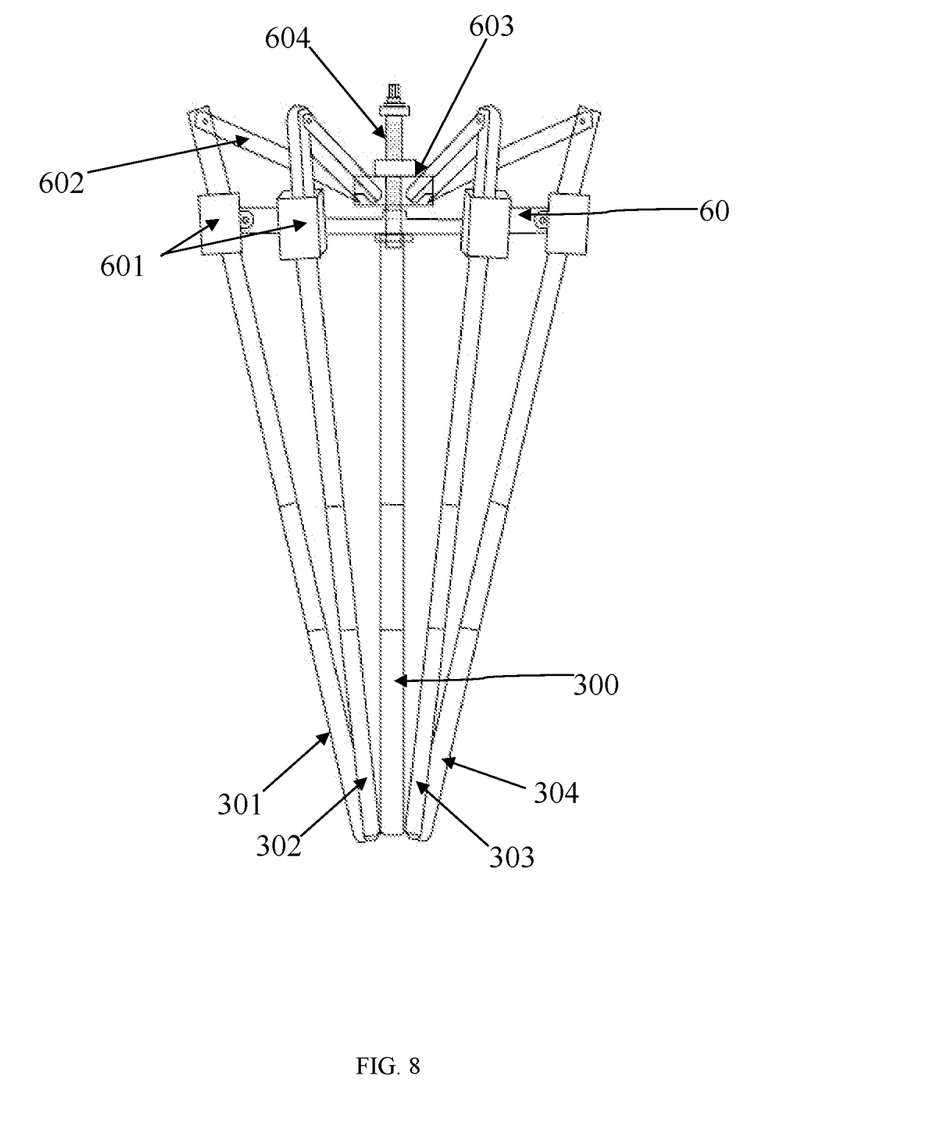
FIG. 8 illustrates a structure in which surrounding auxiliary electrodes expand and collapse relative to a central main electrode according to the present disclosure.

The above implementation can be realized by the structure shown in FIG. 8. The central main electrode 300 and the four auxiliary electrodes 301, 302, 303 and 304 are respectively connected to a copper rod. The copper rod connected to the central main electrode 300 is fixed at a middle of a fixed frame 60. A top end of the copper rod connected to each of the remaining four auxiliary electrodes 301, 302, 303 and 304 is fixed by clamping mechanism 601. There are also four clamping mechanisms 601. The clamping mechanisms 601 each are a seesaw structure, with a middle rotatably connected to the fixed frame. One end of the clamping mechanism 601 is connected to nut 603 through connecting rod 602. The nut 603 is sleeved on threaded rod 604. A bottom end of the threaded rod 604 is integrated with the fixed frame, but can rotate relative to the fixed frame 60. The threaded rod 604 cannot move in a height direction. By rotating the threaded rod 604, the nut 603 moves up and down along the threaded rod 604, thereby pulling the connecting rod 602. The connecting rod 602 pulls the one end of the clamping mechanism 601 to change an angle of the clamping mechanism 601. This drives the four auxiliary electrodes 301, 302, 303 and 304 to expand and collapse relative to the central main electrode 300, thereby adjusting an area of a heat source to fuse different quartz crucibles.

The crucible manufactured in Embodiment 1 is compared with the 28-inch crucible manufactured with the six electrodes in FIG. 3 (Prior Art 1) and FIG. 4 (Prior Art 2). While the graphite electrodes have a power of 1,000 KW, the vacuum degree is −0.093 Mpa to −0.1 Mpa, and the radius of the circumferences for the (auxiliary) electrodes is ¼ of the outer radius of the fused crucible, the crucible is fused with same electrode positions (lower ends of the electrodes are 380 mm away from the bottom of the crucible). A same batch of quartz materials are used by the crucible. The high-purity quartz sand has the purity of greater than or equal to 99.99%.

An atomic absorption method is used to detect an impurity content for the peripheral wall and the bottom of the crucible in Embodiment 1 and Prior Arts 1-2. The average for the impurity content is as shown in Table 1 (two test values are taken at each position, and are averaged. The inner surface with a depth of 20 μm is tested), with a unit being wt.ppb.

TABLE 1

| Category | Zr | Zn | V | Ti | Ni | Na | Al | Mg | Li | K | Fe | Cu | Cr | Ca |
|---|---|---|---|---|---|---|---|---|---|---|---|---|---|---|
| Embodiment 1 | 0.9 | 1 | 0.9 | 20 | 3 | 275 | 610 | 8 | 29 | 18 | 8 | 1 | 0.8 | 60 |
| Prior art 1 | 1 | 1 | 1.1 | 14 | 6 | 460 | 600 | 10 | 38 | 62 | 60 | 1 | 2.1 | 216 |
| Prior art 2 | 1 | 1 | 1 | 36 | 4 | 320 | 660 | 9 | 36 | 29 | 12 | 1 | 1.1 | 80 |

As can be seen from the above table, the inner layer of the crucible manufactured in the Prior Art 2 has a higher purity over the Prior Art 1. The inner layer of the crucible manufactured in the Embodiment 1 has a higher purity over the Prior Art 2. Contents of some elements are the same or slightly higher compared with the prior art. Overall speaking, for the quartz crucible manufactured in the Embodiment 1 of the present disclosure, an average for total contents of various impure elements in the peripheral wall and the bottom on the inner layer is significantly lower than the Prior Art 1 and the Prior Art 2. This indicates that the present disclosure is applied to manufacture of the high-quality quartz crucible.

Likewise, an impurity content for the peripheral wall and the bottom of each of the 32-inch quartz crucible and the 36-inch quartz crucible in Embodiments 2-3 is detected. The average for the impurity content is as shown in Table 2 (two test values are taken at each position, and are averaged. The inner surface with a depth of 20 μm is tested), with a unit being wt.ppb.

TABLE 2

| Category | Zn | Zr | Li | Mg | Na | Ni | Ti | V | Al | Ca | Cr | Cu | Fe | K |
|---|---|---|---|---|---|---|---|---|---|---|---|---|---|---|
| Embodiment 2 | 0.9 | 1 | 29 | 7 | 220 | 1 | 23 | 1 | 620 | 68 | 1 | 1 | 8 | 17 |
| Embodiment 2 | 1 | 1 | 31 | 8 | 210 | 1 | 25 | 1 | 590 | 62 | 1 | 1 | 10 | 18 |

Through the above comparison, the 32-inch quartz crucible and the 36-inch quartz crucible have a same quality as the 28-inch quartz crucible in Embodiment 1. This indicates that the manufacturing method of the present disclosure is very suitable for production of the crucible with the size of 32 inches or more, and can ensure the purity of the inner layer of the crucible.

In conclusion, the inner layer of the quartz crucible manufactured in Embodiments 1-3 of the present disclosure has a lower impurity content and a higher purity. This reduces impurities in crystal pulling production of the monocrystalline silicon, and ensures a production quality of the monocrystalline silicon. In addition, with testing on the quartz glass crucible manufactured in Embodiments 1-3, there are no cracks, no pits, no bubbles and no protrusive points. The solutions in the present disclosure have been used for pilot production in the enterprise, with stable system operation and reliable product quality.

Finally, it should be noted that the above examples are merely intended to describe the technical solutions of the present disclosure, rather than to limit the present disclosure. Although the present disclosure is described in detail with reference to the above examples, persons of ordinary skill in the art should understand that modifications may be made to the technical solutions described in the above examples or equivalent replacements may be made to some or all technical features thereof, which do not make the essence of corresponding technical solutions depart from the scope of the technical solutions in the examples of the present disclosure.

What is claimed is:

1. A manufacturing method of a large-outer-diameter quartz crucible for a Czochralski (CZ) single crystal, wherein the manufacturing method is a vacuum arc method, and comprises: pouring a high-purity quartz sand material into a crucible mold, uniformly forming the quartz sand material on an inner surface of the mold through a forming device to form a crucible blank, releasing a high-temperature arc with an electrode bundle composed of 2N+1 electrodes to fuse the crucible blank, and performing rapid cooling to form an initial quartz crucible product, wherein N is an integer greater than or equal to 2; the 2N+1 electrodes comprise one central main electrode and 2N auxiliary electrodes; the 2N auxiliary electrodes are equidistantly distributed on a circumference with the central main electrode as a center; and the central main electrode is aligned at an axis of the crucible mold; and the 2N auxiliary electrodes are connected to two phases of an industrial three-phase power, and the two phases are alternately arranged on the auxiliary electrodes; the central main electrode is connected to a remaining phase of the industrial three-phase power; and in a fusion process of the crucible blank, discharge between two adjacent ones of the 2N auxiliary electrodes generates a high-temperature arc, and discharge between the 2N auxiliary electrodes and the central main electrode also generates a high-temperature arc.

2. The manufacturing method according to claim 1, wherein N=2-4, specifically, there are five, seven or nine electrodes in the electrode bundle.

3. The manufacturing method according to claim 1, wherein a cross-sectional area of the central main electrode is greater than a cross-sectional area of each single one of the auxiliary electrodes.

4. The manufacturing method according to claim 1, wherein the central main electrode has the cross-sectional area of S1, and the single auxiliary electrode has the cross-sectional area of S2, S1 and S2 satisfying: $1.5S2 \leq S1 \leq 3.8S2$.

5. The manufacturing method according to claim 4, wherein the auxiliary electrode has a diameter of 55-65 mm, and the central main electrode has a diameter of 68-125 mm.

6. The manufacturing method according to claim 1, wherein a lower end surface of the central main electrode and lower end surfaces of the 2N auxiliary electrodes are located on a same plane, and the central main electrode and the 2N auxiliary electrodes each move down with a loss of the electrode.

7. The manufacturing method according to claim 1, wherein with a calculation based on central points of lower end surfaces of the 2N auxiliary electrodes, a radius of the circumference for the 2N auxiliary electrodes is ¼-¾ of an outer radius of a fused crucible.

8. The manufacturing method according to claim 1, wherein the central main electrode is radially fixed; and the 2N auxiliary electrodes are adjustable to expand and collapse relative to the central main electrode.

9. The manufacturing method according to claim 8, wherein with a calculation based on central points of lower end surfaces of the 2N auxiliary electrodes, an expanding and collapsing amplitude of the 2N auxiliary electrodes is as follows: a radius of the circumference for the 2N auxiliary electrodes is ¼-⅔ of an outer radius of a fused crucible.

10. The manufacturing method according to claim 8, wherein the central main electrode and the 2N auxiliary electrodes are respectively connected to a copper rod;

the copper rod connected to the central main electrode is fixed at a middle of a fixed frame;
a top end of the copper rod connected to each of the 2N auxiliary electrodes is fixed by a clamping mechanism;
corresponding to a number of the auxiliary electrodes, there are 2N clamping mechanisms;
a pivotal point at a middle of each of the clamping mechanisms is rotatably connected to the fixed frame;
one end of the clamping mechanism is connected to a nut through a connecting rod;
the nut is sleeved on a threaded rod;
a bottom end of the threaded rod is integrated with the fixed frame, and the threaded rod is a rotating member; and
by rotating the threaded rod, the nut moves up and down on the threaded rod, and drives the 2N clamping mechanisms to expand or collapse, thereby driving the 2N auxiliary electrodes to expand and collapse relative to the central main electrode.

11. The manufacturing method according to claim 2, wherein the central main electrode has a cross-sectional area of S1, and the single auxiliary electrode has a cross-sectional area of S2, S1 and S2 satisfying: $1.5S2 \leq S1 \leq 3.8S2$.

12. The manufacturing method according to claim 3, wherein the central main electrode has the cross-sectional area of S1, and the single auxiliary electrode has the cross-sectional area of S2, S1 and S2 satisfying: $1.5S2 \leq S1 \leq 3.8S2$.

* * * * *